(12) United States Patent (10) Patent No.: US 8,385,148 B2
Kwan et al. (45) Date of Patent: Feb. 26, 2013

(54) SCALABLE, DYNAMIC POWER MANAGEMENT SCHEME FOR SWITCHING ARCHITECTURES UTILIZING MULTIPLE BANKS

(75) Inventors: Bruce Kwan, Sunnyvale, CA (US); Puneet Agarwal, Cupertino, CA (US); Brad Matthews, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 432 days.

(21) Appl. No.: 12/604,108

(22) Filed: Oct. 22, 2009

(65) Prior Publication Data

US 2010/0318821 A1 Dec. 16, 2010

Related U.S. Application Data

(60) Provisional application No. 61/187,248, filed on Jun. 15, 2009.

(51) Int. Cl.
*G11C 5/14* (2006.01)
(52) U.S. Cl. .................. 365/226; 365/189.02
(58) Field of Classification Search ............. 365/189.02, 365/226
See application file for complete search history.

(56) References Cited

U.S. PATENT DOCUMENTS

| | | | |
|---|---|---|---|
| 5,880,741 A * | 3/1999 | Takeuchi | 345/626 |
| 5,892,729 A * | 4/1999 | Holder, Jr. | 365/233.1 |
| 6,580,767 B1 | 6/2003 | Koehler et al. | |
| 7,796,506 B2 | 9/2010 | De Heer et al. | |
| 2002/0039317 A1* | 4/2002 | Shau | 365/222 |
| 2004/0268278 A1* | 12/2004 | Hoberman et al. | 716/5 |
| 2005/0128803 A1* | 6/2005 | Luk et al. | 365/175 |
| 2005/0138276 A1 | 6/2005 | Navada et al. | |
| 2007/0091708 A1 | 4/2007 | Ishimoto et al. | |
| 2007/0121415 A1* | 5/2007 | Fenstermaker et al. | 365/230.06 |
| 2007/0121499 A1 | 5/2007 | Pal et al. | |
| 2009/0039918 A1* | 2/2009 | Madurawe | 326/41 |
| 2009/0152948 A1* | 6/2009 | Hoberman et al. | 307/31 |

OTHER PUBLICATIONS

U.S. Appl. No. 12/604,134 Non-Final Office Action mailed Feb. 27, 2012, 16 pages.

* cited by examiner

*Primary Examiner* — Michael Tran
(74) *Attorney, Agent, or Firm* — Brake Hughes Bellermann LLP

(57) ABSTRACT

According to one general aspect, a method may include receiving data from a network device. In some embodiments, the method may include writing the data to a memory bank that is part of a plurality of at least single-ported memory banks that have been grouped to act as a single at least dual-ported aggregated memory element. In various embodiments, the method may include monitoring the usage of the plurality of memory banks. In one embodiment, the method may include, based upon a predefined set of criteria, placing a memory bank that meets the predefined criteria in a low-power mode.

20 Claims, 11 Drawing Sheets

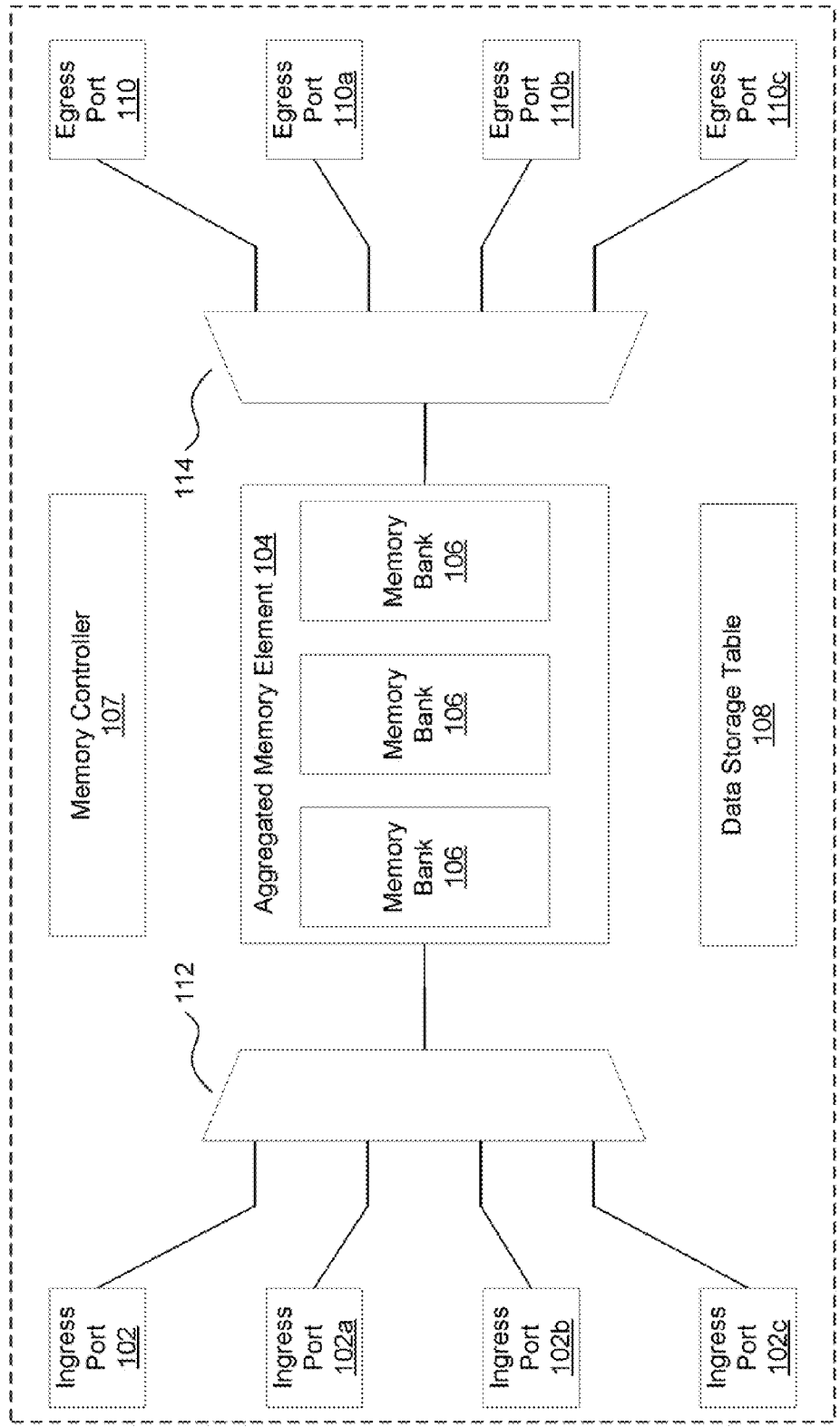

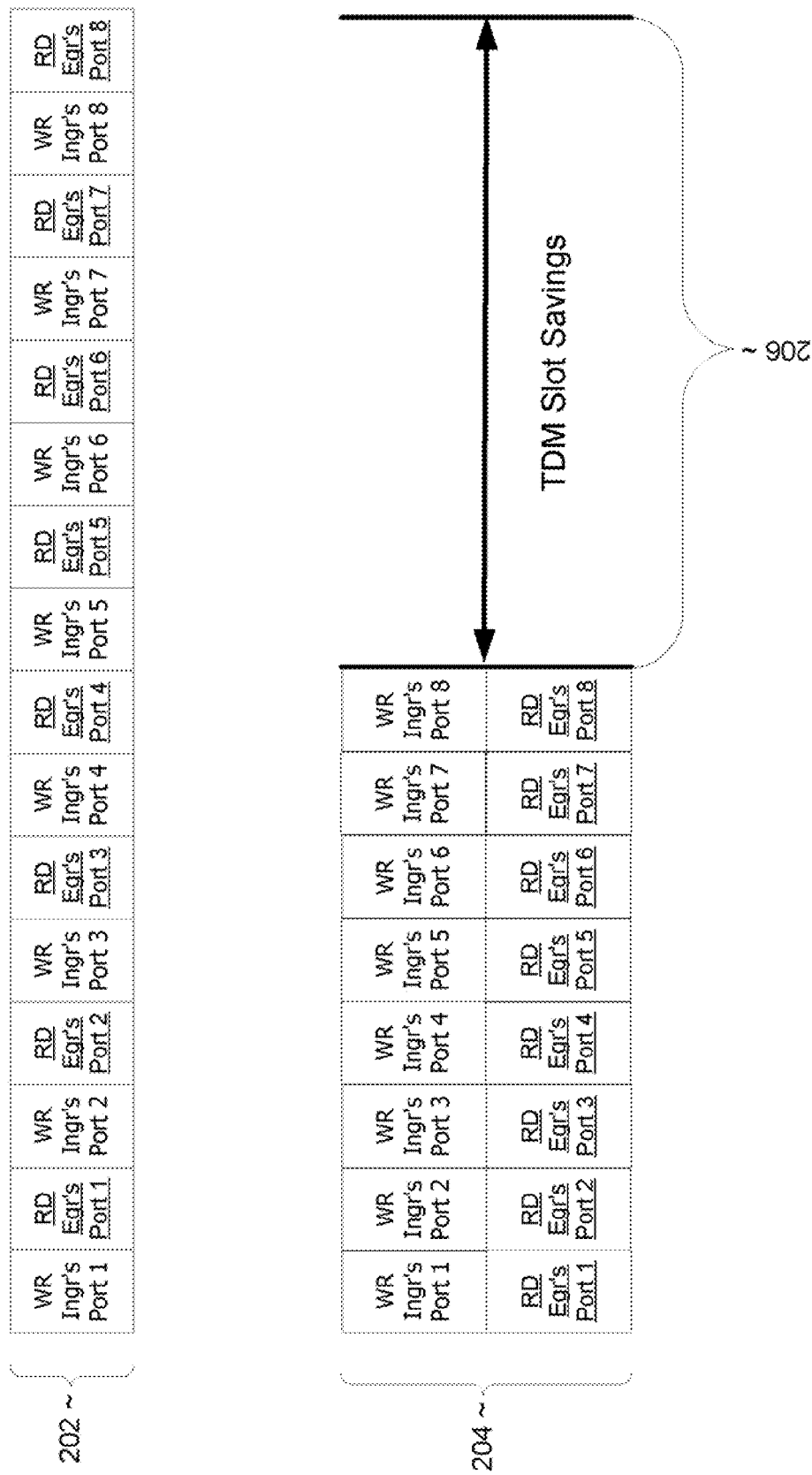

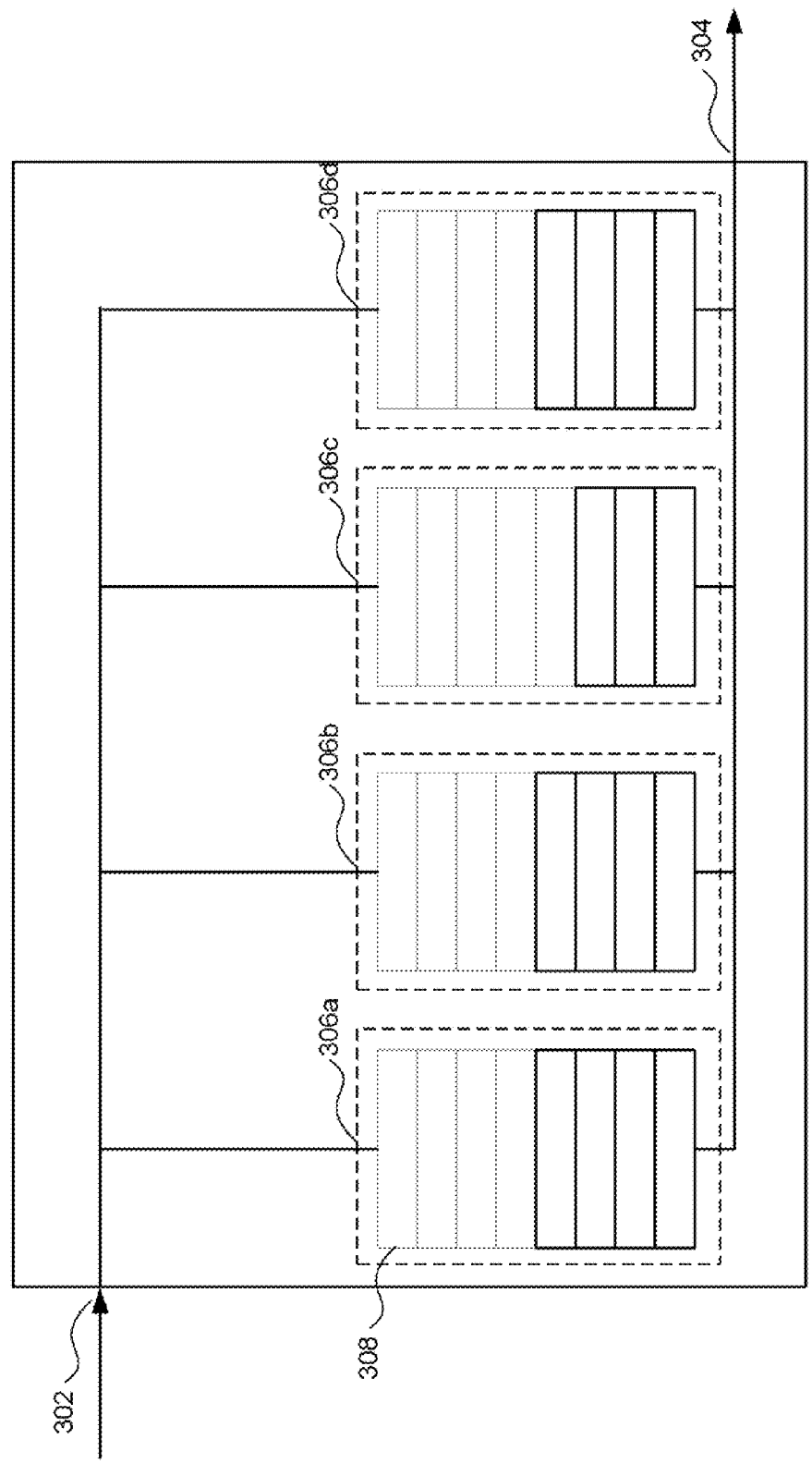

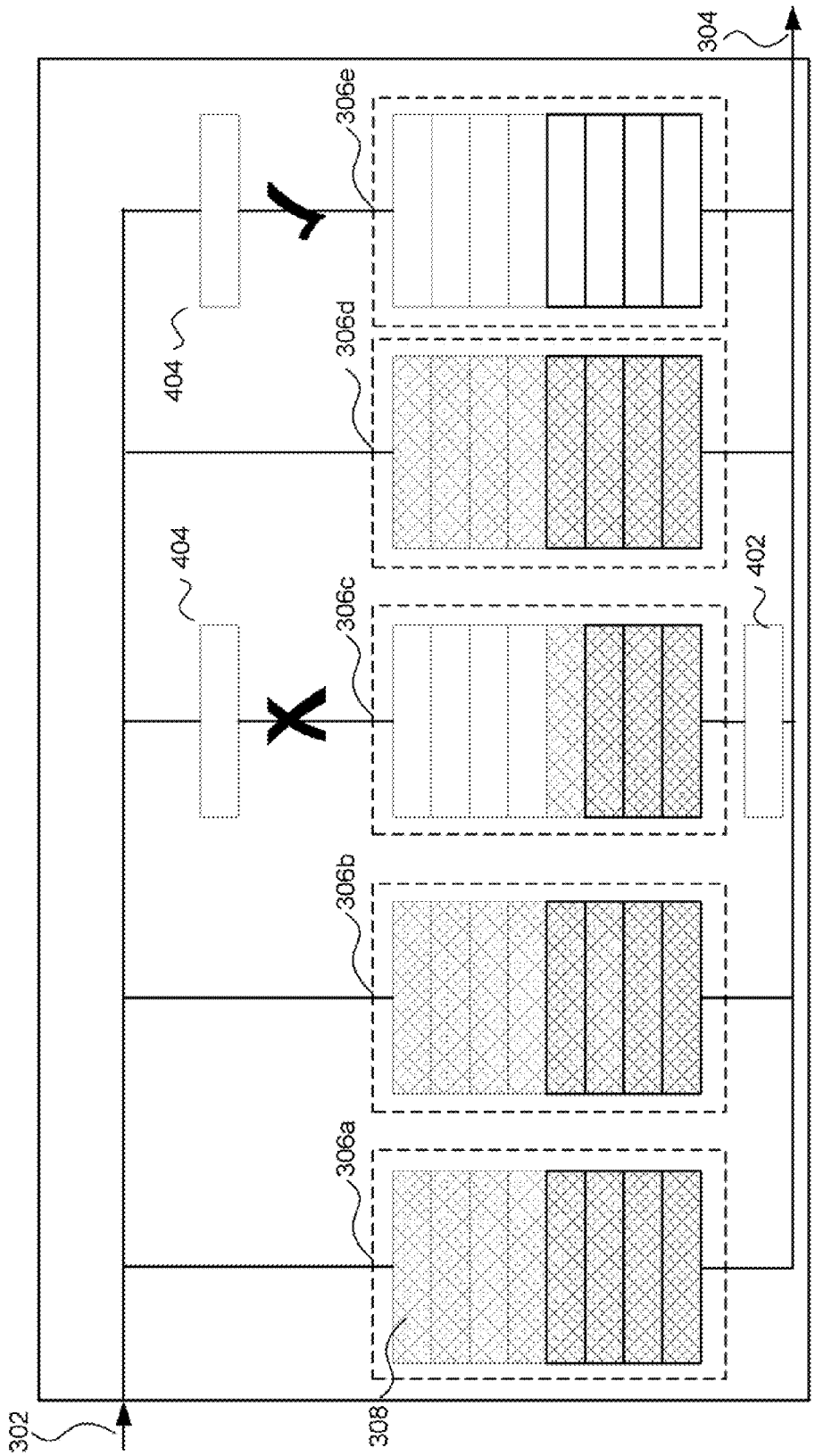

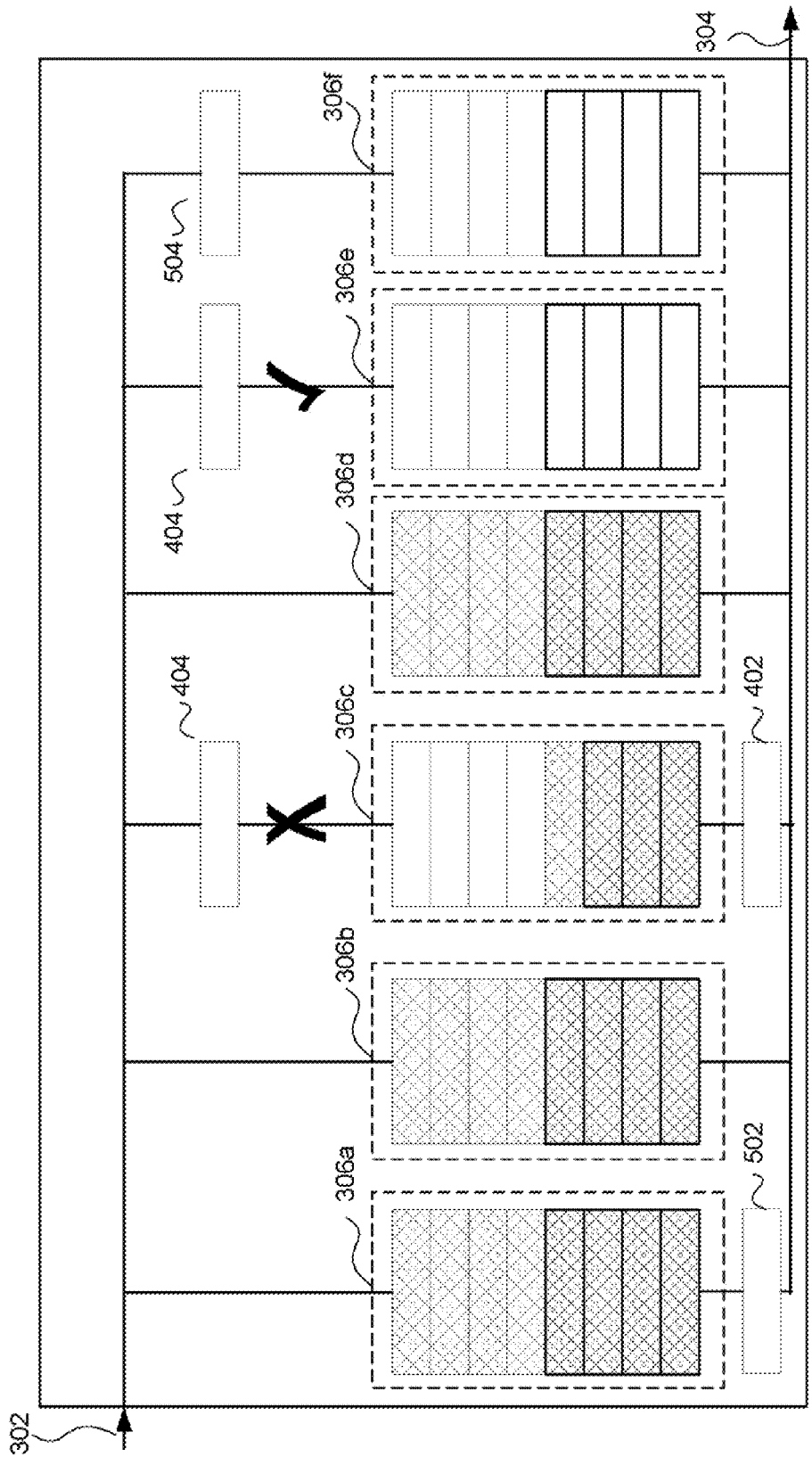

700

FIG. 8
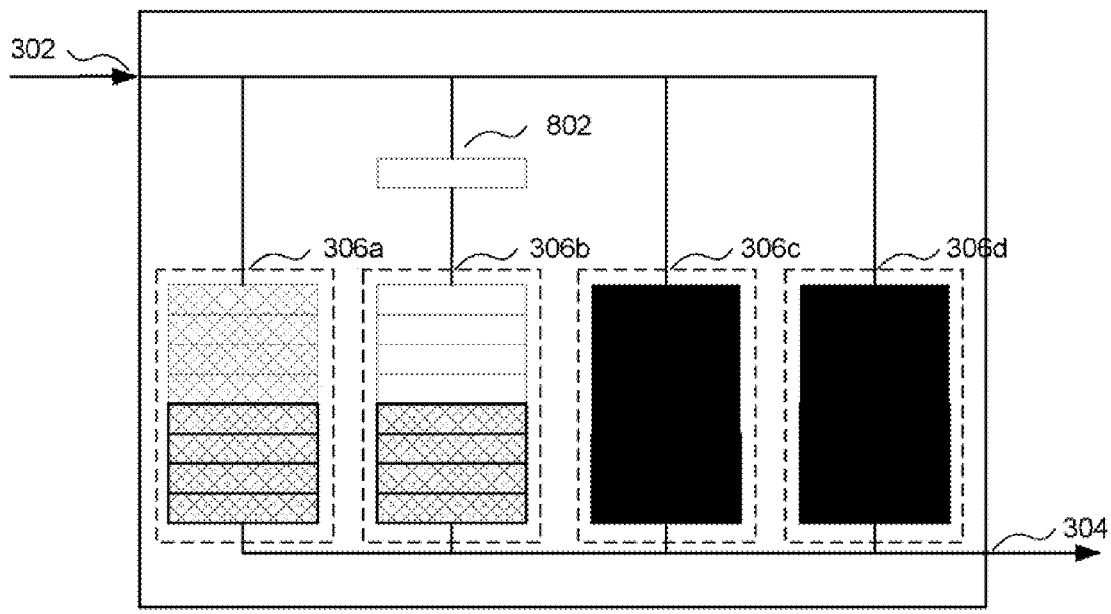
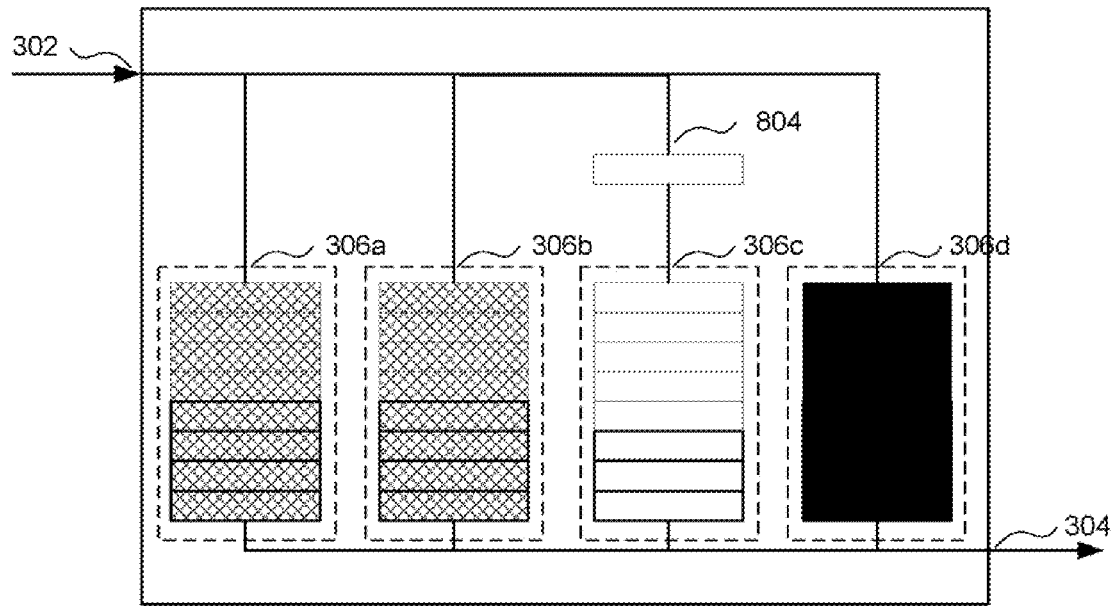

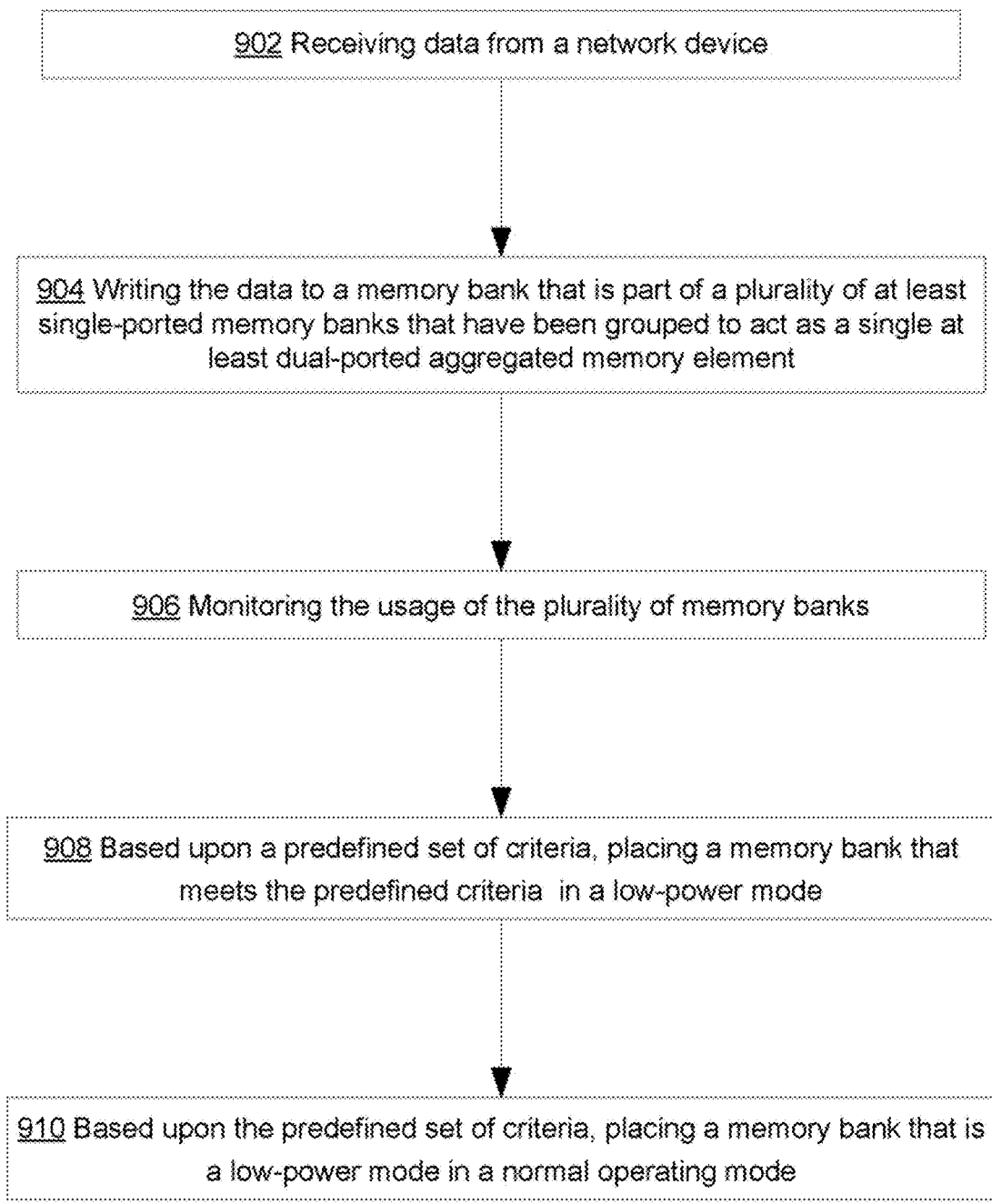

US 8,385,148 B2

SCALABLE, DYNAMIC POWER MANAGEMENT SCHEME FOR SWITCHING ARCHITECTURES UTILIZING MULTIPLE BANKS

CROSS-REFERENCE TO RELATED APPLICATION

This application claims priority under 35 U.S.C. §119 to U.S. Provisional Patent Application 61/187,248, filed Jun. 15, 2009, titled "SCALABLE, DYNAMIC POWER MANAGEMENT SCHEME FOR SWITCHING ARCHITECTURES UTILIZING MULTIPLE BANKS," which is incorporated herein by reference in its entirety.

TECHNICAL FIELD

This description relates to storing information, and more specifically storing information within an aggregated memory element.

BACKGROUND

Random-access memory (RAM) is generally a form of computer or digital data storage. Often, it takes the form of integrated circuits that allow stored data to be accessed in any order (i.e., at random). The word "random" thus refers to the fact that any piece of data can be returned in a substantially constant time, regardless of its physical location and whether or not it is related to the previous piece of data.

Low power, high switch capacity solutions are of great value to the data center market. An optimal approach to realizing high performance systems is to use a shared memory architecture in which multiple resources (e.g., ingress and egress ports, etc.) use a memory element that is shared among them. Achieving a shared memory architecture with high scalability and lower power in today's silicon technology, with cost effective process, is particularly challenging.

One frequently used approach to a shared memory architecture is to simply operate a single bank of memory at very high speeds. This approach is limited the frequency constraints associated with available manufacturing processes. Dual-port solutions that aim to reduce the frequency result in increased consumption of silicon area. Multiple bank solutions that reduce the frequency constraints often suffer read conflict issues that result in underutilization of the memory bandwidth. In addition, balancing write operations evenly can be a challenge. Failing to do so can result in underutilization of memory resources and poor flow control implementations.

A single-ported RAM is a RAM that allows a single read or write operation (colloquially referred to as a "read" or "write") at a time. As a result if a read is occurring at the same time a write is attempted, the write is required to wait until the read operation is completed. A dual-ported RAM (DPRAM) is a type of RAM that allows two reads or writes to occur at the same time, or nearly the same time. Likewise, multi-ported RAMs may allow multiple reads and/or writes at the same time.

Generally, a dual-ported RAM is twice the size and complexity of a single ported RAM. As the number of read/write ports or exclusively read or exclusively write ports increase, the size of the RAM linearly increases. As such, the size of the RAM quickly becomes a design problem. Therefore, as described above, a RAM with a small number of ports (e.g., a single-ported RAM) may be operated at a much higher frequency than the surrounding chip or system in order to effectively service multiple reads and writes during a single system clock cycle. Once again, there is generally a limit upon the frequency the RAM may be operated.

SUMMARY

A system and/or method for communicating information, substantially as shown in and/or described in connection with at least one of the figures, as set forth more completely in the claims.

BRIEF DESCRIPTION OF THE DRAWINGS

FIG. 1 is a block diagram of an example embodiment of a system in accordance with the disclosed subject matter.

FIG. 2 is a block diagram of an example embodiment of a system in accordance with the disclosed subject matter.

FIG. 3 is a block diagram of an example embodiment of a system in accordance with the disclosed subject matter.

FIG. 4 is a block diagram of an example embodiment of a system in accordance with the disclosed subject matter.

FIG. 5 is a block diagram of an example embodiment of a system in accordance with the disclosed subject matter.

FIG. 8 is a block diagram of an example embodiment of a system in accordance with the disclosed subject matter.

FIG. 9 is a flow chart of an example embodiment of a technique in accordance with the disclosed subject matter.

Like reference symbols in the various drawings indicate like elements.

DETAILED DESCRIPTION

Figure 2B:
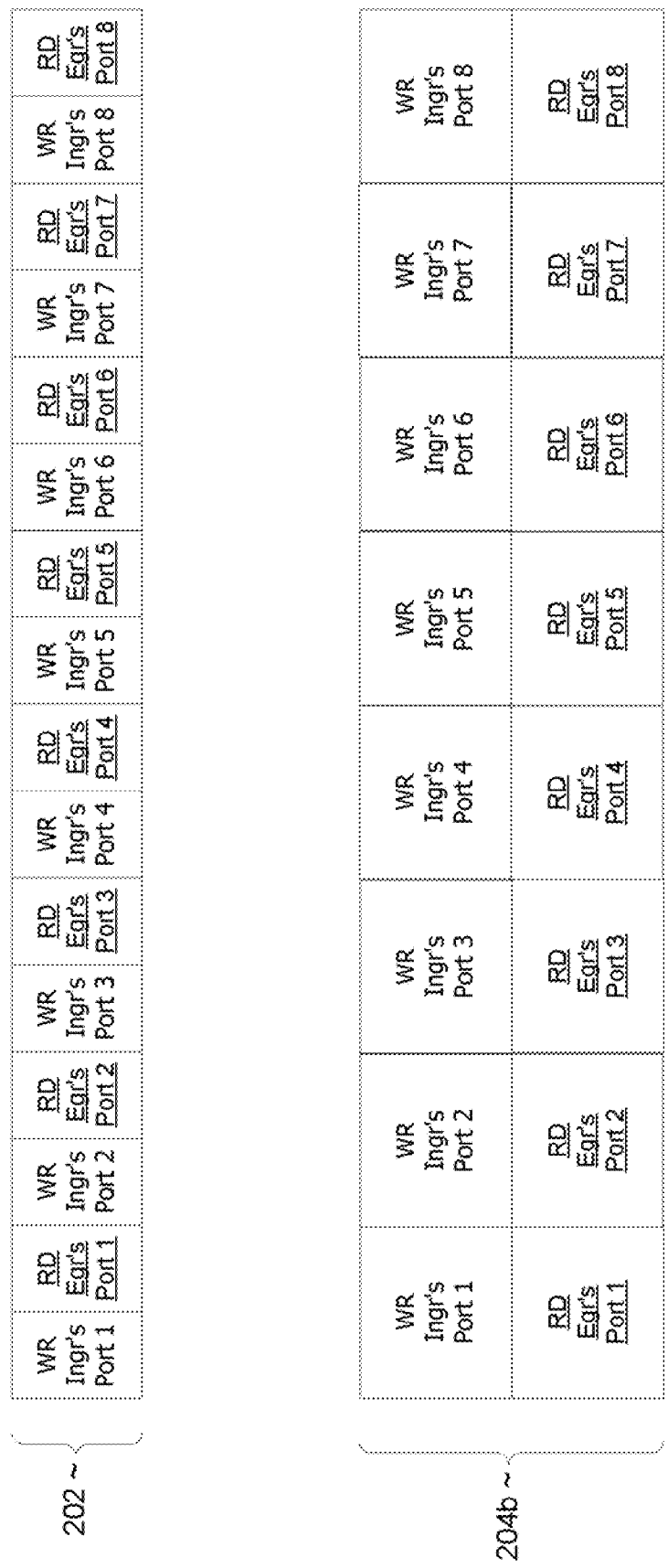
FIG. 2b is a block diagram of an example embodiment of a system in accordance with the disclosed subject matter.

FIG. 1 is a block diagram of an example embodiment of a system or apparatus 100 in accordance with the disclosed subject matter. In one embodiment, the apparatus 100 may include a networking device configured to receive data or data packets from another network device (e.g., a source device, etc.) and transmit or forward the data or data packets to a third network device (e.g., a destination device, etc.); although, it is understood that the above is merely one illustrative example to which the disclosed subject matter is not limited. In one embodiment, the apparatus 100 may include a plurality of ingress ports 102 (e.g., ingress ports 102, 102a, 102b, and 102c, etc.), an aggregated memory element 104, and a plurality of egress ports 110 (e.g., egress ports 110, 110a, 110b, and 110c, etc.).

In various embodiments, the ingress ports 102 may be configured to receive data or packets of data from at least one other apparatus. In one embodiment, the other apparatuses may be other network devices that communicate information via a network of network devices. In another embodiment, the apparatus may not include ingress ports 102, but may include other elements that make use of the shared and aggregated memory element 104.

In various embodiments, the ingress ports 110 may be configured to transmit data or packets of data to at least one other apparatus. In one embodiment, the other apparatuses may be other network devices that communicate information via a network of network devices. In another embodiment, the apparatus may not include egress ports 110, but may include other elements that make use of the shared and aggregated memory element 104.

In various embodiments, as data is received by an ingress port 102, the data may be stored or written, either in whole or part, within the aggregated memory element 104. Subsequently, the egress ports 110 may retrieve or read this data from the aggregated memory element 104 before transmitting the information to the destination or intermediate network device.

In various embodiments, the apparatus 100 may include an aggregated memory element 104. In various embodiments, the aggregated memory element 104 may include a plurality of individual memory banks 106. In one embodiment, each memory bank 106 may include a single-ported memory element, such that a single read or write operation may occur to each memory bank 106 at a time. In various embodiments, the individual memory banks 106 may be arranged such that the aggregated memory element 104 as a whole operates or appears to be a multi-ported memory element that supports multiple substantially simulations read or write operations. In various embodiments, each individual memory bank 106 may include a RAM. Likewise, the aggregated memory element 104 may be configured to substantially act as a RAM.

In one embodiment, the aggregated memory element 104 may be configured to support a write operation to a first memory bank 106 at the same time a read operation is occurring via a second memory bank (illustrated in more detail in regards to FIGS. 3 & 4, etc.). In such an embodiment, the aggregated memory element 104 may be configured to substantially act as a dual-ported RAM. In such an embodiment, due to the single-ported nature of the individual memory banks 106, the aggregated memory element 104 may not be able to simultaneously read and write to/from the same memory bank 104 like a truly dual-ported RAM. Hence, the aggregated memory element's 104 ability to only substantially act as a dual-ported RAM. However, is another embodiment (a version of which is discussed in relation FIGS. 6 & 7), the aggregated memory element 106 may not include this operational limitation. It is understood that in this context the term "substantially" refers to the ability to operate either exactly like or very nearly like a dual or multi-ported RAM or memory element.

In various embodiments, access to the aggregated memory element 104 may be controlled in order to manage the storage of data within the aggregated memory element 104. In one embodiment, the aggregated memory element 104 may be managed or controlled by a memory controller 107. In various embodiments, this memory controller 107 may be integrated into the aggregated memory element 104.

In various embodiments, as described below, the aggregated memory element 104 may be controlled such that read operations are given precedence or preference over write operations. In such an embodiment, read access to the memory banks may be managed or controlled such that a read operation, or multiple read operations may occur from any memory bank 106. And, in one embodiment, write access to the memory banks may be managed or controlled such that a write operation, or multiple write operations may occur to any memory bank which is not being accessed by a read operation.

In various embodiments, in order to properly control the aggregated memory element 104, a table or other scoreboarding component (e.g., data storage table 108) may be used or employed to indicate which data chunk or packet is stored in which individual memory bank 106. In such an embodiment, before a memory access (e.g., a read or a write operation) is attempted, the data storage table 108 may be consulted to determine which individual memory bank 106 will be accessed. In one embodiment, if two memory operations wish to occur simultaneously or in an overlapping fashion (for embodiments in which a memory operation takes more than one clock cycle), the data storage table 108 may be used or employed to determine if the memory operations will occur or utilize the same memory bank 106. If so, special handling conditions may be invoked. In one embodiment, this may involve delaying one of the memory operations, using an overflow memory bank, using a write buffer, etc.; although, it is understood that the above are merely a few illustrative examples to which the disclosed subject matter is not limited.

In various embodiments, the apparatus 100 may include a multiplexing component 112 configured to control, at least partially, access to the aggregated memory element 104 by the plurality of ingress ports 102. Likewise, in one embodiment, the apparatus 100 may include a demultiplexing element 114 configured to control, at least partially, access to the aggregated memory element 104 by the plurality of egress ports 110.

In a preferred embodiment, the individual memory banks 106 may include single-ported memory elements or RAMs. Although, in various embodiments, the individual memory banks 106 may include multi-ported memory elements or RAMs. In some embodiments, the aggregated memory element 104 may include a number of heterogeneous memory banks 106 or a number of homogeneous memory banks 106. While a dual-ported aggregated memory element 104 is illustrated and described in which one read operation and one write operation may occur simultaneously, other embodiments may include aggregated memory elements with different port configurations. For example, the aggregated memory element 104 may include a dual-ported memory element in which two memory operations (e.g., two reads, two writes, one read and one write, etc.) may occur substantially simultaneously. In another embodiment, the aggregated memory element 104 may include more than two ports (e.g., multiple reads, multiple writes, a combination thereof, etc.). In yet another embodiment, aggregated memory element 104 may include an asymmetrical read/write port configuration. It is understood that the above are merely a few illustrative examples to which the disclosed subject matter is not limited.

FIG. 2 is a block diagram of an example embodiment of a system or apparatus in accordance with the disclosed subject matter. In one embodiment, access to the aggregated memory element may be time division multiplexed (TDM). In various embodiments, time division multiplexing is a technique in which a plurality of user resources is given access to a shared resourced based upon time slots (e.g., the infamous timeshare beach condo).

Access pattern 202 illustrates an embodiment, in which eight read ports (e.g., egress ports) and 8 write ports (e.g., ingress ports) are given access to a single ported memory bank. In such an embodiment, a given time period is divided into sixteen segments. Each input/output (IO) port is given one segment (one-sixteenth of the total time period) to perform the IO port's operation. As described above, in order to increase the amount of access to the memory element, it is often necessary to shorten the overall time period (and hence shorten the individual access segments), thus increasing the operational frequency of the memory element.

It is understood that the use of the term "ports" at both the apparatus level (e.g., ingress port, egress port) and at the memory element or bank level (e.g., single-ported, read port, write port, etc.) may be confusing. While attempts to make clear which port or level of ports is being discussed in any sentence, the reader should be aware that the art dictates that the term "port" may be used in two slightly different contexts.

Access pattern 204 illustrates an embodiment in which the same 16 IO ports may access a memory element or bank, if the memory element or bank is dual-ported (e.g., a read port and a write port). Likewise, a time period is divided amongst 16 access operations (8 read operations and 8 write operations). However, as the memory element may facilitate 2 memory operations per time segment, only 8 time segments need to be used. In one embodiment, this may result in reducing the operating frequency by half, such that each time segment would be twice as long as those in access pattern 202. In the illustrated embodiment, the time period of each time segment remains the same as in access pattern 202, but the overall time period is cut in half (illustrated by the TDM Slot Savings 206). In such an embodiment, the access pattern 204 may occur twice in the same amount of time it takes to perform access pattern 202, but at the same operational frequency.

FIG. 2b illustrates another embodiment, in which the access pattern 204b may occur once in the same amount of time it takes to perform access pattern 202, but at a lower (e.g., halved) operational frequency. In such an embodiment, less advanced or lower frequency memory banks or elements may be utilized within a system. It is understood that the above are merely a few illustrative examples to which the disclosed subject matter is not limited.

FIG. 3 is a block diagram of an example embodiment of a system or apparatus in accordance with the disclosed subject matter. In various embodiments, the system or apparatus may include aggregated memory element 300. In one embodiment, the aggregated memory element (AME) 300 may be dual-ported; although, it is understood that the above is merely one illustrative example to which the disclosed subject matter is not limited. In such an embodiment, the AME 300 may include a write port 302 and a read port 304. In various embodiments, the AME 300 may include a plurality of individual memory banks 306 (e.g., memory bank 306a, memory bank 306b, memory bank 306c, memory bank 306d, etc.). In various embodiments, each of the memory banks 306 may be single ported.

In various embodiments, the memory banks 106 may include a plurality of memory words, slots or areas 308 each configured to store one piece of data. In various embodiments, these memory words, slots or areas 308 may be configured to be of different sizes depending on the embodiment (e.g., 1 byte, 36-bits, 64-bits, etc.). In the illustrated embodiments of FIGS. 3, 4, 5, and 7, memory words 308 that do not have data stored within them are illustrated by a white or clear background, and used memory words 308 that do have data stored within them are illustrated by a grayed or crosshatched background.

In various embodiments, various techniques may be employed to control access to the individual memory banks 306. In some embodiments, these techniques may optimize or increase the dual-ported nature or emulation of the AME 300. In various embodiments, these techniques may be employed to increase the number of memory operations that may be accommodated by the AME 300 without increasing the operating frequency of the AME 300.

In one embodiment, read operations may be given preference over write operations. For example, in an embodiment that includes a dual-ported AME 300 comprising a plurality of single-ported memory banks 306, a read and write operation may not occur to the same memory bank at the same time. In such an embodiment, if both a read operation and a write operation wish to access a memory bank (e.g., memory bank 306a), the AME 300 may block the write operation from occurring. In another embodiment, the AME 300 may redirect the write operation to another memory bank (e.g., memory bank 30b).

In various embodiments, write operations may be controlled such that data may be consolidated within a minimum number of memory banks. In such an embodiment, a first write operation may store data within a first memory bank (e.g., memory bank 306a). Subsequent write operations may store data within the first memory bank, until either the memory bank is full or until a read operation also wishes to use the memory bank. In such an embodiment, a write operation may be directed to a second memory bank (e.g., memory bank 306b). In various embodiments, if the write operation was moved due to a read operation, subsequent write operations may occur to the first memory bank (e.g., memory bank 306a). In another embodiment, if the write operation was moved due to the first memory bank being full, if a read operation removes data from the first memory bank such that the first memory bank is no longer full, future write operations may return to the first memory bank (e.g., memory bank 306a).

In one embodiment, write operations may be controlled such that data may be striped across multiple memory banks. In such an embodiment, the number of memory banks 306 utilized may be maximized. This may, in one embodiment, lead to an increased likelihood that a read operation may not conflict, or attempt to use the same memory bank 306 as a simultaneously occurring write operation. In such an embodiment, a first write operation may occur to memory bank 106a. A second write operation may occur to memory bank 106b. A third write operation may occur to memory bank 106c. A fourth write operation may occur to memory bank 106d. A fifth write operation may occur to memory bank 106a, and the process may repeat itself. In some embodiments, in which parallel reads are possible, striping may lead to an increased likelihood that multiple read operations may be successfully performed. In such an embodiment, the overall read throughput of the system may be increased.

In one embodiment, other techniques may be employed to store data or to control write or read operations. For example, in one embodiment, data may be striped across a number of memory banks (e.g., memory banks 306a and 306b), and as the memory banks fill-up or are blocked due to read operations, more memory banks (e.g., memory bank 306c) may be added to the stripping array. In such an embodiment, a combination of the consolidated and striped techniques described above may be employed. It is understood that the above are merely a few illustrative examples to which the disclosed subject matter is not limited.

FIG. 4 is a block diagram of an example embodiment of a system or apparatus in accordance with the disclosed subject matter. In various embodiments, the system or apparatus may include aggregated memory element 400. In one embodiment, the aggregated memory element (AME) 400 may be dual-ported; although, it is understood that the above is merely one illustrative example to which the disclosed subject matter is not limited. In such an embodiment, the AME 400 may include a write port 302 and a read port 304. In various embodiments, the AME 400 may include a plurality of individual memory banks 306 (e.g., memory bank 306a, memory bank 306b, memory bank 306c, memory bank 306d, etc.). In various embodiments, each of the memory banks 306 may be single ported.

In one embodiment, a read operation 402 (illustrated by the removal of a data word) and a write operation 404 (illustrated by the addition of a data word) may attempt to make use of the same memory bank 306c. In such an embodiment, if the memory bank 306a is single-ported memory, two memory operations may not occur simultaneously. In such an embodiment, either the write operation 404 or the read operation 402 would have to be blocked, as the less preferred memory operation accesses the memory bank 306c.

Alternatively, the write operation 404 may be moved from the preferred memory bank 306c to an alternate memory bank (e.g., memory bank 306a, 306b, or 306d in FIG. 3). However, as illustrated by FIG. 4, it is possible that all of the alternative memory banks may be full and unable to accept the write operation 404. In various embodiments, an overflow memory bank or banks 306e may be employed. In such an embodiment, the write operation 404 may be moved from the preferred memory bank 306c to the overflow memory bank 306e.

In various embodiments, the plurality of memory banks (memory banks 306a, 306b, 306c, and 306d) may include a first amount of storage space. For example, in one illustrative embodiment, the AME 400 may be comprised of four 1 megabyte (MB) memory banks 306, totaling 4 MB of storage capacity. In one embodiment, the overflow memory may include a second amount of storage capacity, for example, another 1 MB memory bank 306e. In such an embodiment, the total amount of memory capacity of the AME 400 may be 5 MB or the sum of the first and second storage capacities.

However, in various embodiments, the AME 400 may be controlled to only allow the first amount of storage capacity (e.g., 4 MB) to be utilized between all the memory banks including the overflow memory bank(s) (e.g., memory banks 306a, 306b, 306c, 306d, and 306e). In such an embodiment, it may not be possible or highly unlikely that every memory bank 306 will be filled. Therefore, there may always be an available memory bank capable of fulfilling a write operation, even if a read operation is occurring.

In such an embodiment, the AME 400 may be controlled to allow a total storage capacity between the first and second amounts of storage to be utilized. It is understood that the above are merely a few illustrative examples to which the disclosed subject matter is not limited.

FIG. 5 is a block diagram of an example embodiment of a system or apparatus in accordance with the disclosed subject matter. In various embodiments, the system or apparatus may include aggregated memory element 500. In one embodiment, the aggregated memory element (AME) 500 may be multi-ported, including 2 read ports and 2 write ports; although, it is understood that the above is merely one illustrative example to which the disclosed subject matter is not limited. In such an embodiment, the AME 500 may include write ports 302 and read ports 304. In various embodiments, the AME 500 may include a plurality of individual memory banks 306 (e.g., memory bank 306a, memory bank 306b, memory bank 306c, memory bank 306d, etc.) and a plurality of overflow memory banks (e.g., memory banks 306e and 306f). In various embodiments, each of the memory banks 306 may be single ported.

FIG. 5 illustrates that, in some embodiments, multiple overflow memory banks (e.g., memory banks 306e and 306f) may be employed. In addition, FIG. 5 illustrates that overflow memory banks may also be useful in systems that include multi-ported read operations in which multiple memory banks may be unusable for write operations (if read operations are given preference in the system).

In one embodiment, again read operation 402 and write operation 404 may attempt to access the same memory bank 306c. In addition, a read operation 502 may access memory bank 306a. In such an embodiment, memory banks 306a, 306b, and 306c may be full. As described above, in one embodiment, the write operation 404 may be moved or relocated to the overflow memory bank 306e. T The write operation 504 may be prevented from storing data in memory banks 306a, 306b, or 306d because they are currently full. In addition, the write operation 504 may be prevented from storing data in memory bank 306a (due to read operation 502), memory bank 306c (due to read operation 402) and memory bank 306e (due to write operation 404). In such an embodiment, the write operation 504 may store its data within overflow memory bank 306g.

In one embodiment, an overflow memory bank may be embodied as a dual or multi-write ported memory bank. In such an embodiment, multiple write operations may simultaneously occur to the overflow memory bank and the need or storage capacity of multiple memory banks may be reduced.

Figure 7:
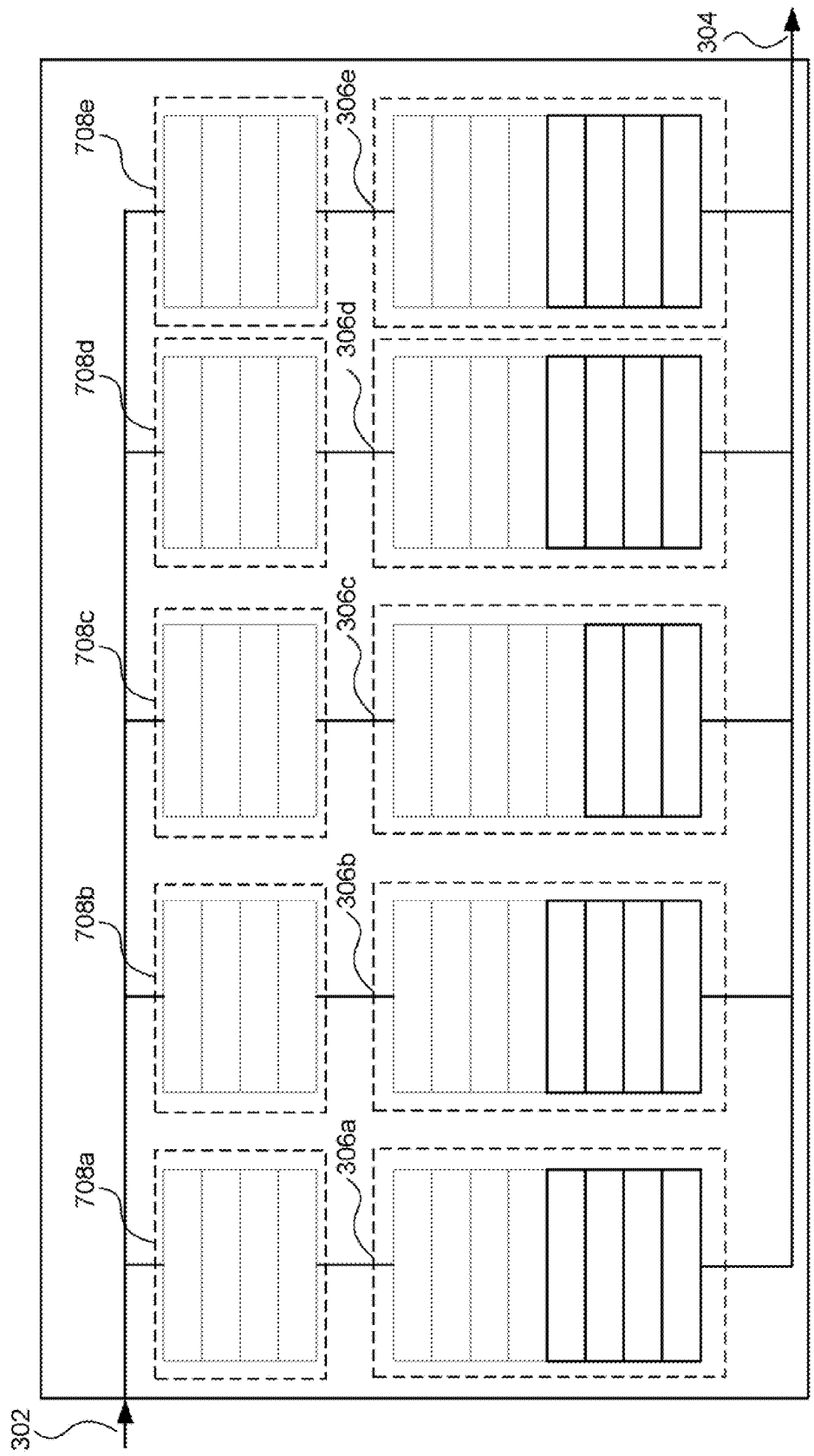
FIG. 7 is a block diagram of an example embodiment of a system in accordance with the disclosed subject matter.

In another embodiment, the overflow memory bank may be conceptual or virtual. In one such embodiment, each or a sub-portion of the plurality of memory banks 306 may include storage capacity that increases the total storage capacity of the AME 500 beyond the first amount of storage capacity, as described above. For example, four 1.5 MB memory banks 306 may be aggregated to form an AME 400 having a useable storage capacity of 4 MB, but a total actual storage capacity of 6 MB. FIG. 7 may be viewed as illustrating an embodiment with a virtual overflow memory bank in which elements 708a, 708b, 708c, 708c, 708d, and 708e may be viewed as the additional storage capacity or words that may comprise the virtual overflow memory bank. Described below, FIG. 7 also illustrates a different embodiment of an aggregated memory element.

Figure 6A:
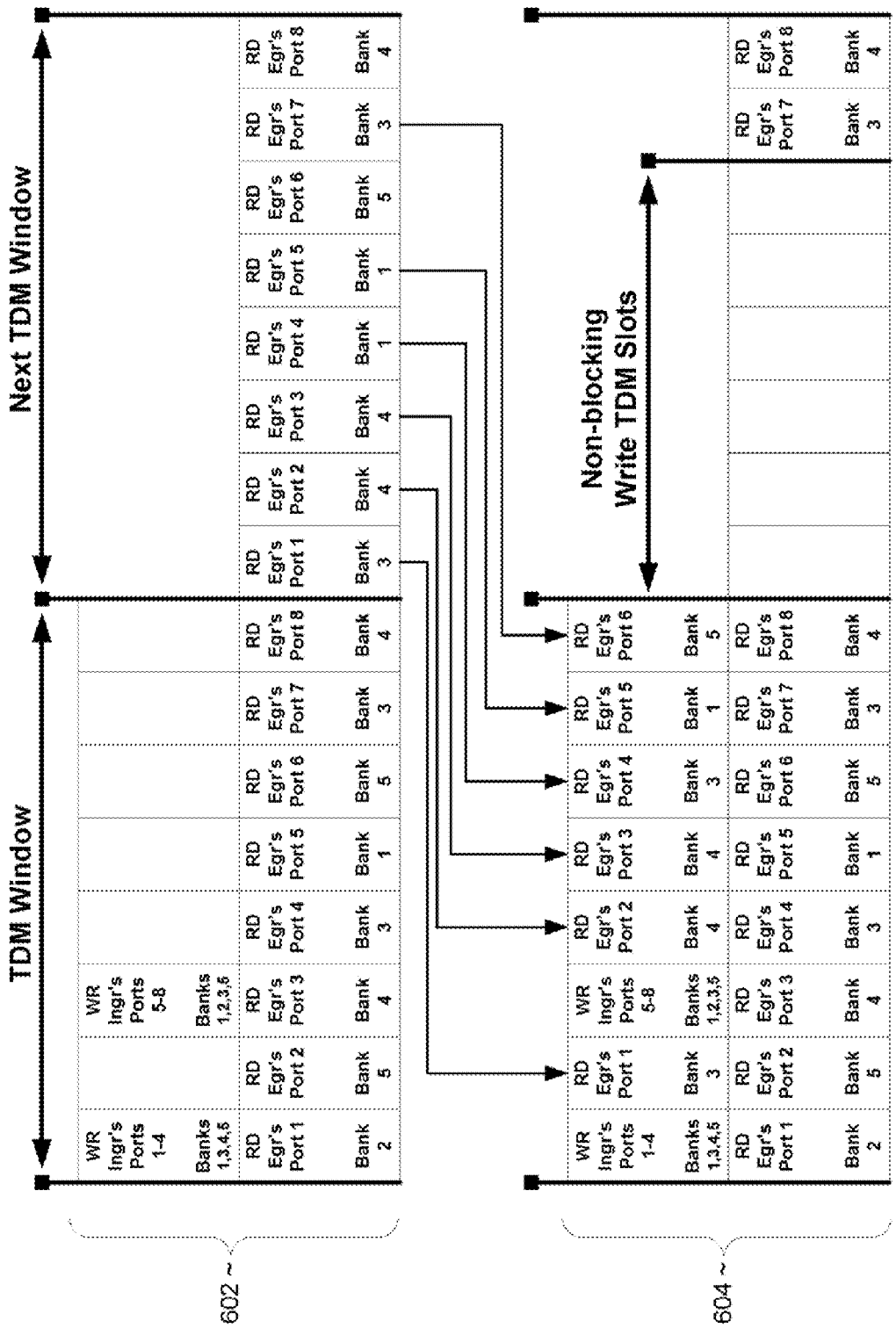
FIG. 6 is a series of block diagrams of an example embodiment of a system in accordance with the disclosed subject matter.

FIG. 6 is a series of block diagrams of an example embodiment of a system or apparatus in accordance with the disclosed subject matter. In one embodiment, the system or apparatus of FIG. 6a may include a multi-ported aggregated memory element (AME). In such an embodiment, the AME may be capable of performing several write operations at once (e.g., including four write ports) but only one or a few read operations at once (e.g., dual read-ported). In such an embodiment, the AME may also include five memory banks; although, it is understood that the above is merely one illustrative example to which the disclosed subject matter is not limited and that in general the AME may include any number of memory banks (e.g., N banks).

Access pattern 602 illustrates one embodiment in which access to the AME has been time division multiplexed (TDM) between eight ingress ports and eight egress ports. The eight ingress ports may generate up to eight write operations per TDM period or window. Likewise, the eight egress ports may be allowed to generate up to eight read operations per TDM window.

In one embodiment, the write operations may be consolidated into two of the eight possible TDM slots or time segments. In one embodiment, in which the AME comprises a plurality of single ported memory banks, a read operation may occur simultaneously with the consolidated write operation if the read operation is not accessing a memory bank accessed by the write operation, or vice versa. For example, if a read operation is occurring to memory bank 5, write operations may occur to memory banks 1, 2, 3, and 4.

In such an embodiment, the consolidated simultaneous write operations may leave six TDM slots or time segments empty or unused. In such an embodiment, leaving such a valuable resource (TDM slots or segments) unused may be undesirable.

In one embodiment, the aggregated memory element may be part of a larger apparatus or system that employed a pipelined architecture. In one such embodiment, the read operations may be substantially deterministic or predictable. Such a result may occur in other embodiments of architectures.

In various embodiments, the pipelined read operations may be re-arranged. For example, access pattern 604 illustrates that some read operations may be moved forward into the first or an earlier TDM window. In such an embodiment, six TDM slots or time segments may be freed during the subsequent TDM window. These freed TDM slots or time segments may be made available for other read or write operations.

Figure 6B:
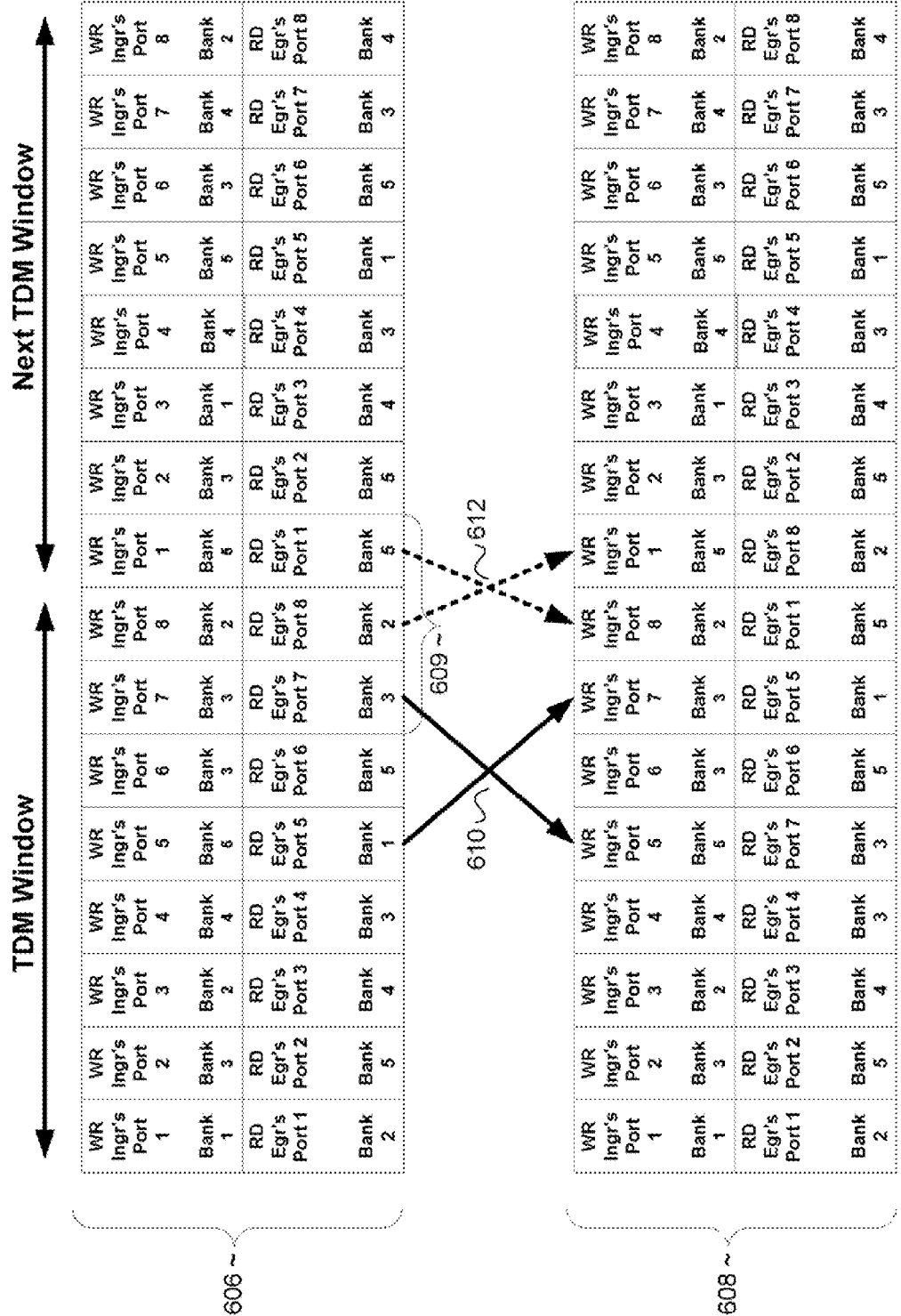

In one embodiment, the system or apparatus of FIG. 6b may include a dual-ported aggregated memory element (AME). In such an embodiment, the AME may be capable of performing two memory operations at once. In such an embodiment, the AME may also include five memory banks.

Access pattern 606 illustrates that, in one embodiment, a number of TDM slots or time segments (illustrated by TDM slots 609) may include conflicting read and write operations that attempt or desire to access the same memory bank (e.g., memory banks 2, 3, and 5). In various embodiments, as described above, such conflicts may result in a blocked write operation or a write to an overflow memory bank.

Access pattern 608 illustrates that, in various embodiments, pipelined read operations may be re-arranged within a TDM window to avoid conflicts created by read operations and write operations associated with the same memory bank. As described above, in a dual-ported AME embodiment, a read operation and a write operation to the same memory bank may be scheduled for the same TDM slot or time segment. In such an embodiment, the apparatus may re-arrange the timing of read operation such that the read operation and write operation occur in different TDM slots or time segments. Re-arrangement 610 illustrates re-arranging read operations within a single TDM window. Re-arrangement 612 illustrates re-arranging read operations across multiple TDM windows.

It is understood that a similar re-arrangement technique may be used or employed with pipelined write operations. It is also understood that the above are merely a few illustrative examples to which the disclosed subject matter is not limited.

FIG. 7 is a block diagram of an example embodiment of a system or apparatus in accordance with the disclosed subject matter. In one embodiment, the apparatus may include the aggregated memory element 700. In one embodiment, the aggregated memory element (AME) 700 may be multi-ported, including at least 1 read port and several write ports; although, it is understood that the above is merely one illustrative example to which the disclosed subject matter is not limited. In such an embodiment, the AME 700 may include write ports 302 and read ports 304. In various embodiments, the AME 700 may include a plurality of individual memory banks 306 (e.g., memory bank 306a, 306b, 306c, 306d, and 306e, etc.). In various embodiments, one or more of the memory banks 306 may be an overflow memory bank (e.g., memory banks 306e). In various embodiments, each of the memory banks 306 may be single ported.

As described above, in various embodiments, FIG. 7 may be used to illustrate an AME that includes a virtual overflow buffer created from the additional memory words 708a, 708b, 708c, 708d, and 708e. In addition, in various embodiments, FIG. 7 may be used to illustrate an AME that includes a plurality of write buffers 708 (e.g., write buffers 708a, 708b, 708c, and 708e) that are configured to temporarily store or cache the data from write operations such that the data may be written to the memory banks 306 at a later time or TDM slot.

In one embodiment, when a write and a read operation both try to access the same memory bank (e.g., memory bank 306a). As described above, due to the single-ported nature of the memory bank 306a, multiple memory operations may not be permitted, in various embodiments. As described above, in some embodiments, this may result in writing data to an overflow memory bank or re-arranging one of the memory operations; although, it is understood that the above are merely a few illustrative examples to which the disclosed subject matter is not limited.

However, in the illustrated embodiment, the data from the write operation may be written to the write buffer 708a. This data may then be committed or written to the memory bank 306a during a later TDM slot or time segment when the memory bank 306a is not being accessed. In various embodiments, this committal or clearing of the write buffer 708a may occur without affecting the TDM scheduling or the ability to write data via the AME's 700 write port 302.

In such an embodiment, from the exterior of the AME 700, the AME 700 may appear to be fully dual-ported, but internally the AME 700 may delay a write operation to accommodate the single-ported nature of the memory bank 306a. In various embodiments, this may result in two or more write operations occurring to multiple memory banks 306 simultaneously. For example, buffered data may be written to a first memory bank (e.g., memory bank 306a) as unbuffered data is written to a second memory bank (e.g., memory bank 306c) as a result of a TDM scheduled write operation; although, it is understood that the above is merely one illustrative example to which the disclosed subject matter is not limited.

In various embodiments, the write buffers 708 may be configured to allow multiple simultaneous write operations to the AME 700, for example, as illustrated by FIG. 6a. In some embodiments, the write buffers 708 may be configured to allow write operations to occur to the AME 700 as substantially any time. As the various write operations are received by the AME 700, the write data may be cached within the write buffers 708, regardless of which memory banks 306 are currently being accessed by any read operations. In such an embodiment, when a read operation is not occurring on a memory bank (e.g., memory bank 306b) the respective write buffer (e.g., write buffer 708b) may opportunistically perform a write operation to the memory bank (e.g., memory bank 306b) by transferring data from the write buffer to the memory bank. In various embodiments, if the number of read ports 304 on AME 700 is less than the number of memory banks 306 (e.g., dual read-ported AME 700 with 5 memory banks 306), a number of write buffers 708 may write their buffered data in parallel to their respective unused or read operation-free memory banks 306.

FIG. 8 is a block diagram of an example embodiment of a system or apparatus in accordance with the disclosed subject matter. In one embodiment, the apparatus may include the aggregated memory element 800. In one embodiment, the aggregated memory element (AME) 800 may be multi-ported, including at least 1 read port and 1 write port; although, it is understood that the above is merely one illustrative example to which the disclosed subject matter is not limited. In such an embodiment, the AME 800 may include write ports 302 and read ports 304. In various embodiments, the AME 800 may include a plurality of individual memory banks 306 (e.g., memory bank 306a, 306b, 306c, and 306d, etc.). In various embodiments, each of the memory banks 306 may be single ported.

In one embodiment, the aggregated memory bank 800 may be controlled in order to minimize or at least reduce the number of memory banks 306 that include data. In various embodiments, this may be done in order to minimize power consumption; although, it is understood that the above is merely one illustrative example to which the disclosed subject matter is not limited.

In various embodiments, unused memory banks 306 (illustrated in FIG. 8 by a black background) may be disabled, switched off or placed in a low-power mode. In some embodiments, a low power-mode may include halting or stopping the clock signal to at least a portion of the unused memory banks 306. In one embodiment, a portion of the powered-down memory banks 306 may remain active or powered in order to service requests to re-power or enable the memory banks or remove the memory banks from the low-power mode. In this context, memory banks referred to as being in a "normal operating mode" include memory banks that are not in low-power mode. The memory banks of FIGS. 3, 4, 5, and 7 may be said to have been or be in a "normal operating mode".

In one embodiment, the aggregated memory element 800 may be configured to restrict placement of data words to subset of total available memory banks (e.g., memory banks 306a & 306b). In such an embodiment, when a write operation occurs, the write operation 802 may be directed toward one of the un-restricted or non-powered down memory banks (e.g., memory banks 306a & 306b).

In another embodiment, once the currently powered or normal operating mode memory banks 306a & 306b are filled, one of the powered-down or low-power mode memory banks 306c may be powered-up or returned to a normal operating mode. In some embodiments, the memory bank 306c may be powered-up when a write operation 804 is known of (e.g., in pipelined architectures, etc.) or arrives at the AME 800. In another embodiment, the memory bank 306c may be powered-up as a result of the memory banks 306a and 306b filling to their storage capacity. In yet another embodiment, the memory bank 306c may be powered-up as a result of a write operation to either of the memory banks 306a and 306b being blocked due to a simulations read operation, as described above.

In various embodiments, a memory bank 306 may require a non-negligible amount of time in order to transition from a low-powered mode to a normal operating mode. In such an embodiment, instantaneously powering-up a memory bank 306 may not be possible or desirable. In such an embodiment, the conversion of the memory bank (e.g., memory bank 306c) to a normal operating mode upon receipt of the write operation 804 may not be desirable. Although, it is understood that the above is merely one illustrative example to which the disclosed subject matter is not limited.

In various embodiments, the AME 800 may be configured to utilize a Largest Bank Not Full (LBNF) placement policy to place or direct arriving data words (via write operations) to the memory bank 306b that is in normal operating mode and is not full, but is currently storing the most data words. Although, it is understood that the above is merely one illustrative example to which the disclosed subject matter is not limited.

In another embodiment, the AME 800 may be configured to keep at least two memory banks 306 that are not full and in a normal operating mode. In such an embodiment, if a read operation wishes to access one of the two non-full or partially empty memory banks 306, a simultaneous write operation may be directed to the other non-full memory bank 306. In such an embodiment, a write operation may always be fulfilled without having to remove a previously unused memory bank 306 from a low-power mode.

In such an embodiment, the AME 800 may be configured to maintain a predefined number of memory banks 306 that are in a normal operating mode. In another embodiment, the AME 800 may be configured to maintain a predefined number of memory banks 306 are both in a normal operating mode and not full, or, in one embodiment, include a minimum number of unused data words. In such an embodiment, the minimum number of unused data words or other measure of unused storage capacity may be a predefined value. In various embodiments, this predefined value may change based, at least in part, upon the number or ratio of memory banks 306 in a normal operating mode versus a low-powered mode.

In one embodiment, the AME 800 may be configured to place unused memory banks 306 in a low-powered mode. In various embodiments, as a memory bank (e.g., memory bank 306c) is emptied via read operations, the AME 800 may place the now empty memory bank in to a low-power mode.

In various embodiments that include memory banks that include non-volatile memory storage (e.g., flash RAM, ferromagnetic RAM, optical memory, etc.), memory banks may be placed in a low-power mode if they have not been accessed within a predetermined amount of time. In such an embodiment, as a non-volatile memory bank, stored data may not be lost when the memory bank is placed in a low-power mode.

In another embodiment involving volatile memory storage, the AME 800 may be configured to place memory banks in a variety of low-power modes. In such an embodiment, memory banks that are not empty but infrequently accessed may be placed in a low-power mode that consumes less power than a normal operating mode, but still sufficient power to maintain the integrity of the stored data. In various embodiments, a second low-power mode may exist that may be used for empty memory banks. In such a mode, the power provided to maintain the integrity of the data need not be provided because no such data exists in the empty memory bank. It is understood that the above are merely a few illustrative examples to which the disclosed subject matter is not limited.

In various embodiments, the AME 800 may be configured to provide power management of the memory banks 306 or a sub-set thereof. In such an embodiment, memory bank 306 power consumption may be reduced when the system or apparatus is lightly loaded since unused memory banks (e.g., memory banks 306c & 306d) may be disabled or placed in a low-power mode. In various embodiments, power consumption may increase as a function of the system or apparatus load, as more memory banks 306 are enabled or placed in a normal operating mode.

FIG. 9 is a flow chart of an example embodiment of a technique in accordance with the disclosed subject matter. In various embodiments, the technique 900 may be used or produced by the systems such as those of FIG. 1, 3, 4, 5, 7, or 8. Furthermore, portions of technique 900 may be used or produced by the systems such as that of FIG. 2 or 6. Although, it is understood that the above are merely a few illustrative examples to which the disclosed subject matter is not limited. It is understood that the disclosed subject matter is not limited to the ordering of or number of actions illustrated by technique 900.

Block 902 illustrates that, in one embodiment, data may be received from a network device, as described above. In one embodiment, the data may be received via an ingress port, as described above. In various embodiments, one or more of the action(s) illustrated by this Block may be performed by the apparatuses or components of FIG. 1, 3, 4, 5, 7 or 8, the aggregated memory elements of FIG. 1, 3, 4, 5, 7 or 8, or the ingress ports 102 of FIG. 1, as described above.

Block 904 illustrates that, in one embodiment, the data may be written to a memory bank that is part of a plurality of at least single-ported memory banks that have been grouped to act as a single at least dual-ported aggregated memory element, as described above. In various embodiments, writing may include selecting a memory bank to write the data to, such that a maximum possible number of memory banks may be in a low-power mode, as described above. In some embodiments, writing may include writing data to a memory bank that includes the most amount of data but is not full, as described above.

In some embodiments, writing may include selecting a memory bank to write the data to, as described above. In various embodiments, writing may include determining if the selected memory bank is currently in a low-power mode, as described above. In one embodiment, writing may include, if the selected memory bank is currently in a low-power mode, restoring the selected bank to a normal operating mode, as described above. In various embodiments, writing may include writing the data to the selected memory bank, as described above.

In various embodiments, one or more of the action(s) illustrated by this Block may be performed by the apparatuses or components of FIG. 1, 3, 4, 5, 7 or 8, the aggregated memory elements of FIG. 1, 3, 4, 5, 7 or 8, or the memory controller 107 of FIG. 1, as described above.

Block 906 illustrates that, in one embodiment, the usage of the plurality of memory banks may be monitored, as described above. In various embodiments, monitoring may include reducing the power consumption of the aggregated memory element as the usage of the plurality of memory banks is reduced, as described above.

In some embodiments, monitoring may include detecting the completion of a write operation, as described above. In various embodiments, monitoring may include determining if the write operation caused a memory bank to become full, as described above. In one embodiment, monitoring may include, if the write operation caused a memory bank to become full, determining if at least one other memory bank is operating in a normal operating mode and is not full, as described above. In various embodiments, monitoring may include, if no other memory bank is operating in a normal operating mode and is not full, removing a memory bank from a low-power mode and placing the memory bank into a normal operating mode, as described above.

In various embodiments, one or more of the action(s) illustrated by this Block may be performed by the apparatuses or components of FIG. 1, 3, 4, 5, 7 or 8, the aggregated memory elements of FIG. 1, 3, 4, 5, 7 or 8, or the memory controller 107 of FIG. 1, as described above.

Block 908 illustrates that, in one embodiment, based upon a predefined set of criteria, a memory bank that meets the predefined criteria may be placed in a low-power mode, as described above. In some embodiments, the predefined set of criteria include may include that a predefined number of non-full memory banks that must be kept in a normal operating mode, as described above.

In some embodiments, placing a memory bank in a low-power mode may include placing the memory bank in either a first low-power mode or a second low-power mode, as described above. In some embodiments, the first low-power mode may include maintaining the integrity of any data stored within the memory bank, as described above. In various embodiments, the second low-power mode may include reducing the power consumption of the memory bank below that required to maintain the integrity of any data stored within the memory bank, as described above.

In various embodiments, one or more of the action(s) illustrated by this Block may be performed by the apparatuses or components of FIG. 1, 3, 4, 5, 7 or 8, the aggregated memory elements of FIG. 1, 3, 4, 5, 7 or 8, or the memory controller 107 of FIG. 1, as described above.

Block 910 illustrates that, in one embodiment, based upon the predefined set of criteria, a memory bank that is a low-power mode may be placed in a normal operating mode, as described above. In various embodiments, one or more of the action(s) illustrated by this Block may be performed by the apparatuses or components of FIG. 1, 3, 4, 5, 7 or 8, the aggregated memory elements of FIG. 1, 3, 4, 5, 7 or 8, or the memory controller 107 of FIG. 1, as described above.

It is understood that while many of the above embodiments have illustrated or included single-ported memory banks, the disclosed subject matter is not so limited. In some embodiments, the plurality of memory banks may be dual-ported or even multi-ported. In various embodiments, the plurality of memory banks may be heterogeneous, or, in another embodiment, homogeneous. Further, as described above, the aggregated memory element may include multi-ports, in various embodiments.

Implementations of the various techniques described herein may be implemented in digital electronic circuitry, or in computer hardware, firmware, software, or in combinations of them. Implementations may be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD)

monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A method comprising:
   receiving data from a network device;
   writing the data to a memory bank that is part of a plurality of at least single-ported memory banks that have been grouped to act as a single at least dual-ported aggregated memory element;
   monitoring the usage of the plurality of memory banks; and
   based upon a predefined set of criteria regarding a storage capacity of one or more of the memory banks, placing a memory bank that meets the predefined criteria in a low-power mode.

2. The method of claim 1, wherein writing includes: selecting a memory bank to write the data to; determining if the selected memory bank is currently in a low-power mode; if the selected memory bank is currently in a low-power mode, restoring the selected bank to a normal operating mode; and writing the data to the selected memory bank.

3. The method of claim 1, wherein writing includes: selecting a memory bank to write the data to, such that a maximum possible number of memory banks may be in a low-power mode.

4. The method of claim 1, wherein the predefined set of criteria include: a predefined number of non-full memory banks that must be kept in a normal operating mode.

5. The method of claim 1, wherein writing includes: writing data to a memory bank that includes the most amount of data but is not full.

6. The method of claim 1, wherein monitoring includes: detecting the completion of a write operation; determining if the write operation caused a memory bank to become full; if so, determining if at least one other memory bank is operating in a normal operating mode and is not full; and if not, removing a memory bank from a low-power mode and placing the memory bank into a normal operating mode.

7. The method of claim 1, wherein monitoring includes: reducing the power consumption of the aggregated memory element as the usage of the plurality of memory banks is reduced.

8. The method of claim 1, further including: based upon the predefined set of criteria, placing a memory bank that is a low-power mode in a normal operating mode.

9. The method of claim 1, wherein placing a memory bank in a low-power mode includes: placing the memory bank in either a first low-power mode or a second low-power mode; wherein the first low-power mode includes maintaining the integrity of any data stored within the memory bank; and wherein the second low-power mode includes reducing the power consumption of the memory bank below that required to maintain the integrity of any data stored within the memory bank.

10. An apparatus comprising:
    a plurality of ingress ports configured to receive data from at least one other apparatus;
    an aggregated memory element configured to store at least part of the data received from the at least one other apparatus, wherein the aggregated memory element includes a plurality of at least single-ported memory banks arranged to substantially act as a single at least dual-ported aggregated memory element;
    a memory controller configured to:
        monitor the usage of the aggregated memory element, and
        based upon a predefined set of criteria regarding a storage capacity of one or more of the memory banks, place a memory bank that meets the predefined criteria in a low-power mode; and
    a plurality of egress ports configured to transmit data to at least one other apparatus.

11. The apparatus of claim 10, wherein the memory controller is configured to: select a memory bank to write the data to; determine if the selected memory bank is currently in a low-power mode; if the selected memory bank is currently in a low-power mode, restore the selected bank to a normal operating mode; and cause the aggregated memory element to write the data to the selected memory bank.

12. The apparatus of claim 10, wherein the memory controller is configured to: select a memory bank to write data to, such that a maximum possible number of memory banks may be in a low-power mode.

13. The apparatus of claim 10, wherein the predefined set of criteria include: a predefined number of non-full memory banks that must be kept in a normal operating mode.

14. The apparatus of claim 10, wherein the aggregated memory element is configured to: write data to a memory bank that includes the most amount of data but is not full.

15. The apparatus of claim 10, wherein the memory controller is configured to: detect the completion of a write operation; determine if the write operation caused a memory bank to become full; if so, determine if at least one other memory bank is operating in a normal operating mode and is not full; and if not, remove a memory bank from a low-power mode and placing the memory bank into a normal operating mode.

16. The apparatus of claim 10, wherein the memory controller is configured to: reduce the power consumption of the aggregated memory element as the usage of the plurality of memory banks is reduced.

17. The apparatus of claim 10, wherein the memory controller is configured to: based upon the predefined set of criteria, place a memory bank that is a low-power mode in a normal operating mode.

18. The apparatus of claim 10, wherein the memory controller is configured to: place the memory bank in either a first low-power mode or a second low-power mode; wherein the first low-power mode includes maintaining the integrity of any data stored within the memory bank; and wherein the second low-power mode includes reducing the power consumption of the memory bank below that required to maintain the integrity of any data stored within the memory bank.

19. A computer program product for storing information, the computer program product being tangibly embodied on a non-transitory computer-readable medium and including executable code that, when executed, is configured to cause a networking apparatus to:
    receive data from a network device;
    write the data to a memory bank that is part of a plurality or at least single-ported memory banks that have been grouped to act as a single at least dual-ported aggregated memory element;
    monitor the usage of the plurality of memory banks; and
    based upon a predefined set of criteria regarding a storage capacity of one or more of the memory banks, control whether or not members of the plurality of memory banks are placed in a low-power mode.

20. The computer program product of claim 19, wherein the executable code, when executed, is configured to cause the networking apparatus to: utilize a largest-bank-not-full placement policy to restrict storage of data to a subset to the plurality of memory banks.

* * * * *